US006570459B1

(12) United States Patent
Nathanson et al.

(10) Patent No.: US 6,570,459 B1
(45) Date of Patent: May 27, 2003

(54) PHYSICS PACKAGE APPARATUS FOR AN ATOMIC CLOCK

(75) Inventors: Harvey C. Nathanson, Pittsburgh, PA (US); Irving Liberman, Pittsburgh, PA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/003,197

(22) Filed: Oct. 29, 2001

(51) Int. Cl.[7] .................................................. H03B 17/00
(52) U.S. Cl. ........................................................ 331/94.1
(58) Field of Search ............................. 331/3, 94.1, 176

(56) References Cited

FOREIGN PATENT DOCUMENTS

EP 0 550 240 A1 * 7/1993

* cited by examiner

*Primary Examiner*—David C. Mis

(57) ABSTRACT

Physics package apparatus for a cell type atomic clock includes a cell structure having a central plate sandwiched between top and bottom plates. The central plate has a central interior aperture which together with the top and bottom plates forms an internal cavity for containment of an active vapor. The central plate includes a reservoir for holding a source of the active vapor, and a channel connecting the reservoir with the internal cavity. A heater is provided on the underside of the bottom plate for heating the vapor. The plates are batch processed on respective wafers which are subsequently joined together and cut into individual cell structures.

17 Claims, 6 Drawing Sheets

PHYSICS PACKAGE APPARATUS FOR AN ATOMIC CLOCK

BACKGROUND OF THE INVENTION

1. Field of the Invention

The invention in general relates to atomic frequency standards, and more particularly to components of a physics package for an atomic clock of the type which utilizes an optically pumped cell containing a vapor.

2. Description of Related Art

Atomic clocks are utilized in various systems which require extremely accurate and stable frequencies, such as in bistatic radars, GPS (global positioning system) and other navigation and positioning systems, as well as in communications, cellular phone systems and scientific experiments, by way of example.

In one type of atomic clock, a cell containing an active medium such as cesium (or rubidium) vapor is irradiated with both optical and microwave energy whereby light from an optical source pumps the atoms of the vapor from a ground state to a higher state from which they fall to a state which is at a hyperfine wavelength above the ground state. The microwave signal is tuned to a particular frequency so as to repopulate the ground state. In this manner a controlled amount of the light is propagated through the cell and is detected by means of a photodetector.

By examining the output of the photodetector, a control means provides various control signals to ensure that the wavelength of the propagated light and microwave frequency are precisely controlled.

There is a need, both in the military and civilian sectors, for an ultra small, completely portable, highly accurate and extremely low power atomic clock. The atomic clock must operate continuously for 24 hours per day to perform a useful function. For this reason, power levels approaching 100 milliwatts, or less, are desirable for military and many civilian uses.

The non-electronic portion of the atomic clock is often referred to as the physics package and, as will be described, includes power consuming elements such that the physics package promises to be the determiner of the size, low power capabilities and ultimate low cost of the final product.

It is a primary object of the present invention to provide physics package apparatus for an atomic clock, which is of small size, for example, 1 $cm^3$, or less, and which meets low cost, ease of fabrication and low power usage requirements.

SUMMARY OF THE INVENTION

Physics package apparatus for a cell type atomic clock in accordance with the present invention includes a cell structure having a central plate sandwiched between top and bottom plates. The central plate has a central interior aperture which together with the top and bottom plates forms an internal cavity for containment of an active vapor. The central plate includes a reservoir for holding a source of the active vapor, and a channel connecting the reservoir with the internal cavity.

Apertures on either end of the central plate respectively accommodate a laser diode, which projects a laser beam through the vapor, and a detector for detecting the projected beam. End walls of the interior aperture may include curved portions for shaping and focusing the laser beam.

A microwave coupling arrangement, such as strip line conductors couples microwave energy into the vapor-containing cavity. For a complete physics package, insulation, a C-field coil and a surrounding metallic magnetic shield may be included.

DESCRIPTION OF THE PREFERRED EMBODIMENT

Figure 1:
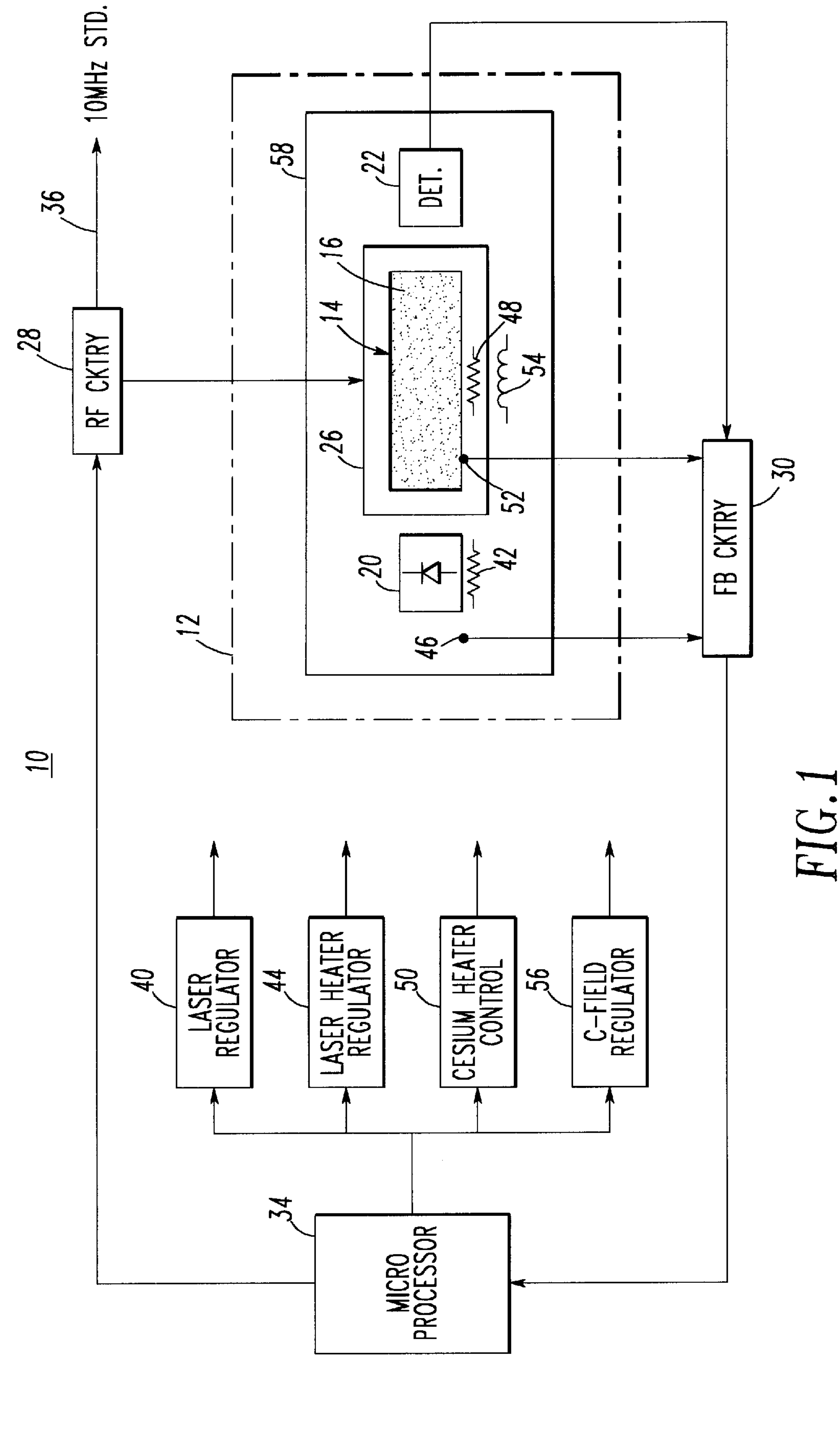
FIG. 1 is a simplified block diagram of a typical atomic clock.

In the drawings, which are not necessarily to scale, like or corresponding parts are denoted by like or corresponding reference numerals. In addition, the terms top and bottom are used herein for ease of explanation and not as structural or orientational limitations.

FIG. 1 basically illustrates an atomic frequency standard, or atomic clock, 10, of the type which includes a physics package 12 having a cell 14 filled with an active vapor 16 such as a vapor of cesium or rubidium.

An optical pumping means, such as a laser diode 20 is operable to transmit a light beam of a particular wavelength through the active vapor 16, which is excited to a higher state. Absorption of the light in pumping the atoms of the vapor to the higher states is sensed by a photodetector 22 which provides an output signal proportional to the impinging light beam on the detector.

Adjacent to the cell 14 is a microwave cavity 26, or the like, which couples a precisely controlled rf (radio frequency) signal to cell 14. Assuming an active vapor 16 of cesium, the rf signal is tuned to the microwave atomic transition frequency of the cesium vapor 16, of approximately 9.2 GHz, so that the ground state depleted by the laser diode 20 is repopulated at an enhanced rate.

The rf signal is provided by rf circuitry 28 and when the frequency of the rf signal is precisely at the desired hyperfine magnetic dipole transition frequency, the amount of light passing through cell 14 to detector 22 will be at a minimum. The output of detector 22 is provided, via feedback circuitry 30, to a master control such as microprocessor 34, which in turn controls the frequency provided by rf circuitry 28. A separate output 36 of the rf circuitry 28 delivers the desired time standard, such as a 10 MHz clock signal.

A laser current regulator 40, in response to signals from microprocessor 34, controls the current to laser diode 20, which in turn controls the wavelength emitted, to match the absorption of the vapor (852 nm for cesium). Typically the laser must also be controlled in temperature.

A laser current regulator 40, in response to signals from microprocessor 34, controls the current to laser diode 20, which in turn controls the wavelength emitted, to match the absorption of the vapor (852 nm for cesium). Typically the laser must also be controlled in temperature to establish the desired wavelength. This is accomplished with the provision of laser heater 42, under control of laser heater regulator 44. A temperature sensor 46 monitors the laser temperature and provides a corresponding temperature output signal to the microprocessor 34, via feedback circuitry 30.

In order to generate the required vapor pressure in cell 14, the vapor 16 is heated by a heater 48. The precisely controlled cell temperature is accomplished with the provision of heater control 50, in conjunction with temperature sensor 52 which monitors the cell temperature at the coldest point in the vapor envelope and provides this temperature indication, via feedback circuitry 30, to microprocessor 34.

The physics package 12 additionally includes a C-field coil 54, under control of C-field regulator 56, to generate a uniform background magnetic field, to minimize the effects of stray external magnetic fields. In addition, a magnetic field metallic shield 58 is generally provided to further isolate the cell 20 from external fields.

Further details of the components and operation of the atomic clock 10 are described in U.S. Pat. Nos. 5,192,921, 5,327,105, 5,606,291 and 5,852,386, all of which are hereby incorporated by reference.

The physics package, and its components, of the present invention meets the desired requirements of small size, for portability and low power consumption, for continual 24 hour use. In addition, the components can be batch fabricated, resulting in lower overall costs for the atomic clock. An embodiment of the invention is shown in FIGS. 2 to 5.

Figure 2:
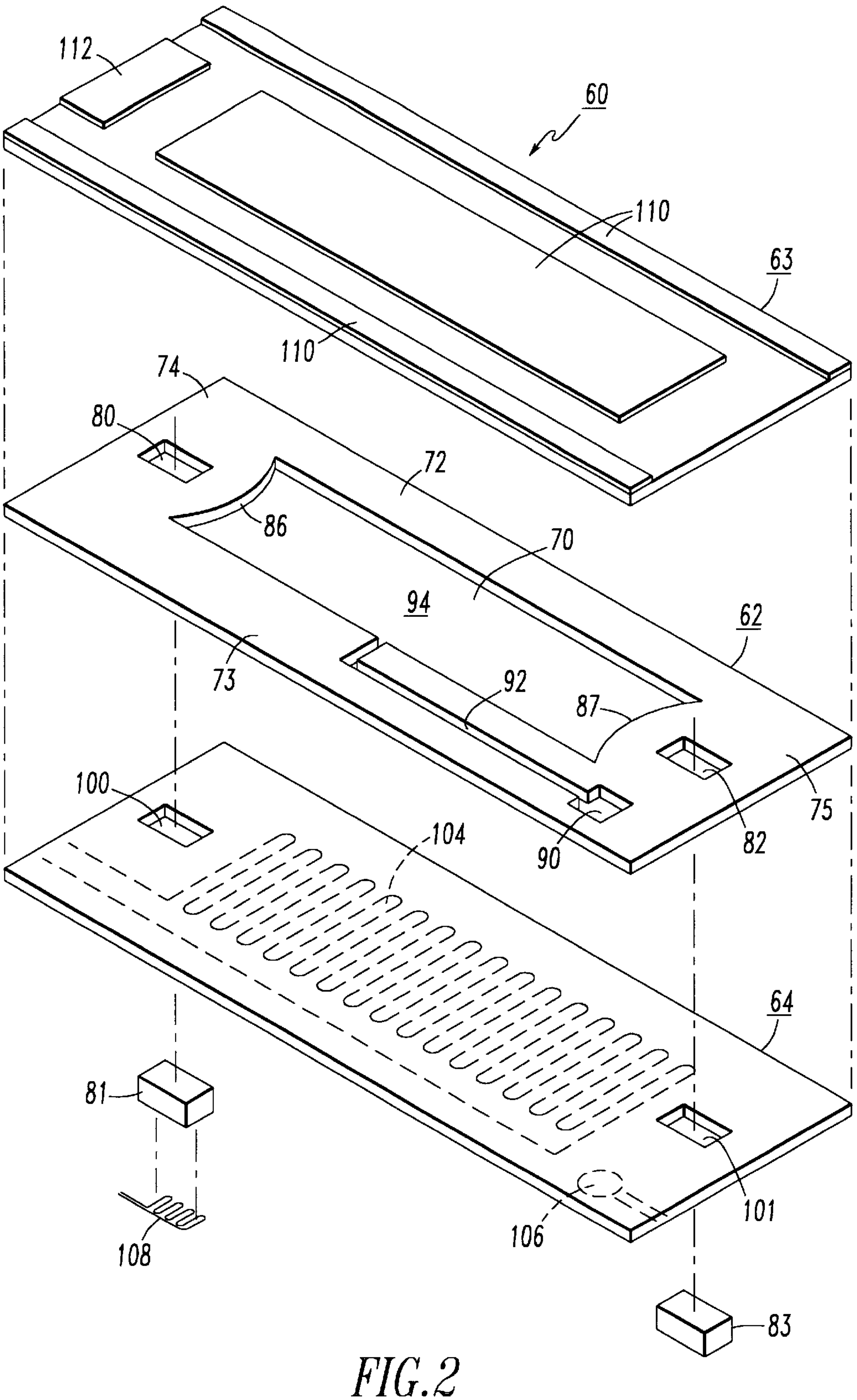
FIG. 2 is an exploded view of an active vapor cell structure used in a physics package.

The exploded view of FIG. 2 illustrates a cell structure 60 comprised of a central plate 62 which is sandwiched between top and bottom plates 63 and 64. Central plate 62 includes a central interior aperture 70 extending completely through the plate and defining leg sections 72 and 73, as well as end sections 74 and 75.

An aperture 80 in end section 74 receives laser diode 81, such as a vertical cavity surface emitting laser, and aperture 82 in end section 75 receives detector 83. These apertures are an optional feature of the cell structure 60 in as much as one, or both, of the laser diode 81 and detector 83 may be positioned outside the end sections 74 and 75, respectively.

A wall of interior aperture 70 may be curved, adjacent laser 81, so as to define a lens portion 86 to collimate the laser beam projected through interior aperture 70. Similarly, an opposite wall of interior aperture 70, adjacent detector 83 may also be curved to define lens portion 87, for focusing the projected laser beam onto the detector 83.

Central plate 62 additionally includes a well, or reservoir 90 into which will be placed the source of the vapor, for example, cesium, which migrates, in gaseous form, into the interior aperture 70, via channel 92. When sealed with the top and bottom plates 63 and 64, the interior aperture 70 forms an internal cavity 94 for the cesium vapor, as well as any buffer gas which normally may be utilized.

Bottom plate 64 includes, at either end, respective apertures 100 and 101 to accommodate the insertion of laser diode 81 and detector 83 into apertures 80 and 82 in central plate 62, after which, the apertures 100 and 101 may be sealed.

In order to maintain the cesium in a gaseous state, at a precise temperature and pressure, the internal cavity 94 is heated. This is accomplished with the provision of serpentine heater 104 on the underside of bottom plate 64, which also includes a temperature sensor 106 for obtaining a temperature indication of the cesium in reservoir 90. This temperature sensor 106 provides an indication of the coldest spot in the vapor system, which determines the cesium vapor pressure within cavity 94. Another heater, 108, is affixed to a surface of the laser diode 81 to control its temperature and also to double as a temperature sensor.

Microwave signals may be coupled into the cesium cell by several different means. FIG. 2 illustrates, by way of example, a microstrip coupling arrangement. More particularly, top plate 63 includes strip line electrodes 110 and an input electrode 112, all of which are deposited on the surface thereof. As will be shown, a ground plane (not illustrated in FIG. 2) is also provided on the opposite side of cavity 94. Microstrip coupling arrangements are described in more detail in the aforementioned U.S. Pat. Nos. 5,192,921 and 5,327,105.

Figure 3A:
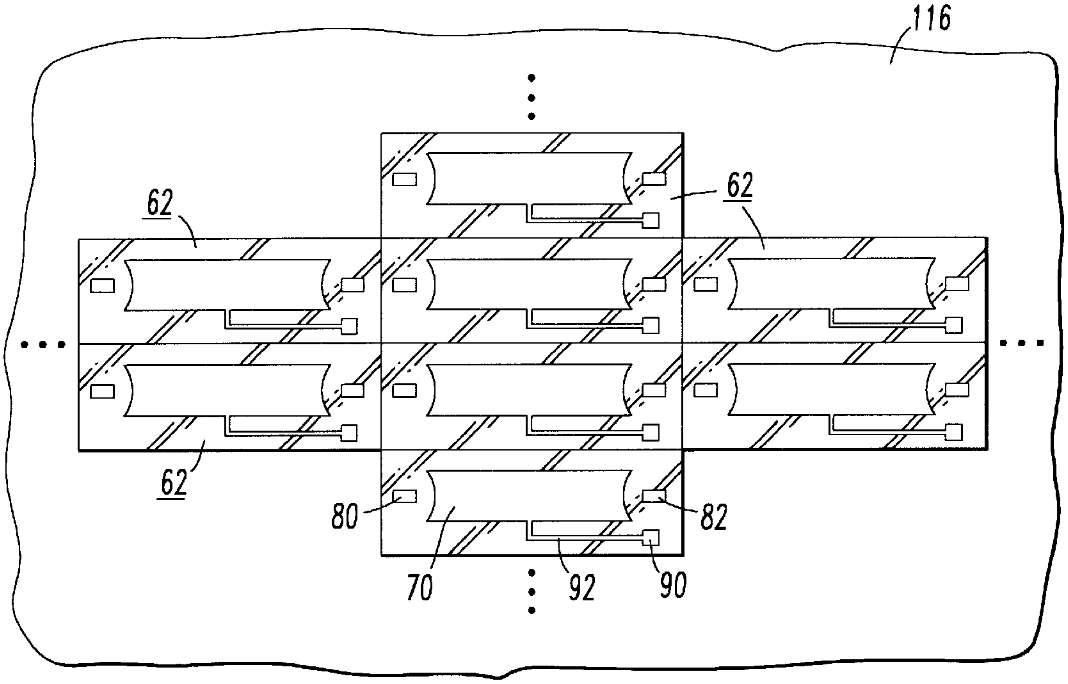
FIGS. 3A, 3B and 3C illustrate components of the cell structure of FIG. 2, on respective wafers.

The cesium cell structure 60 of FIG. 2 lends itself to batch processing methods whereby many tens of such structures can be fabricated simultaneously. For example FIG. 3A shows a portion of a wafer 116. By well-known photolithographic techniques a photo resist material is deposited over the surface of the wafer and thereafter masked with a pattern of central plates 62.

The masked assembly is exposed to ultra-violet light, making the photo resist material soluble in the areas to be removed. These areas, apertures 70, 80, 82, are then formed by an etching process. Further, the cesium reservoir 90 and channel 92 may also be etched all the way through the thickness of the plate 62, whereby bottom plate 64 will serve as the bottom of reservoir 90 and channel 92, when fully assembled.

Figure 3B:
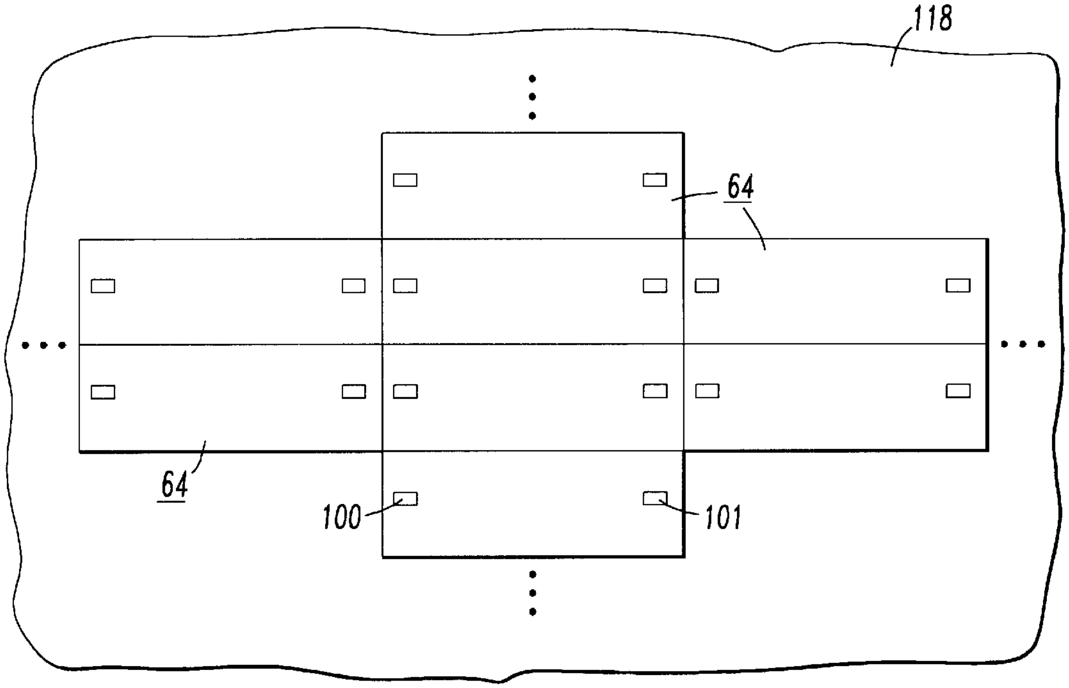

As indicated in FIG. 3B, bottom plate 64 may be fabricated on wafer 118 by similar methods, after which, heaters 104 and sensors 106 (FIG. 2) may be deposited on the undersurface of the bottom plates 64.

Figure 3C:
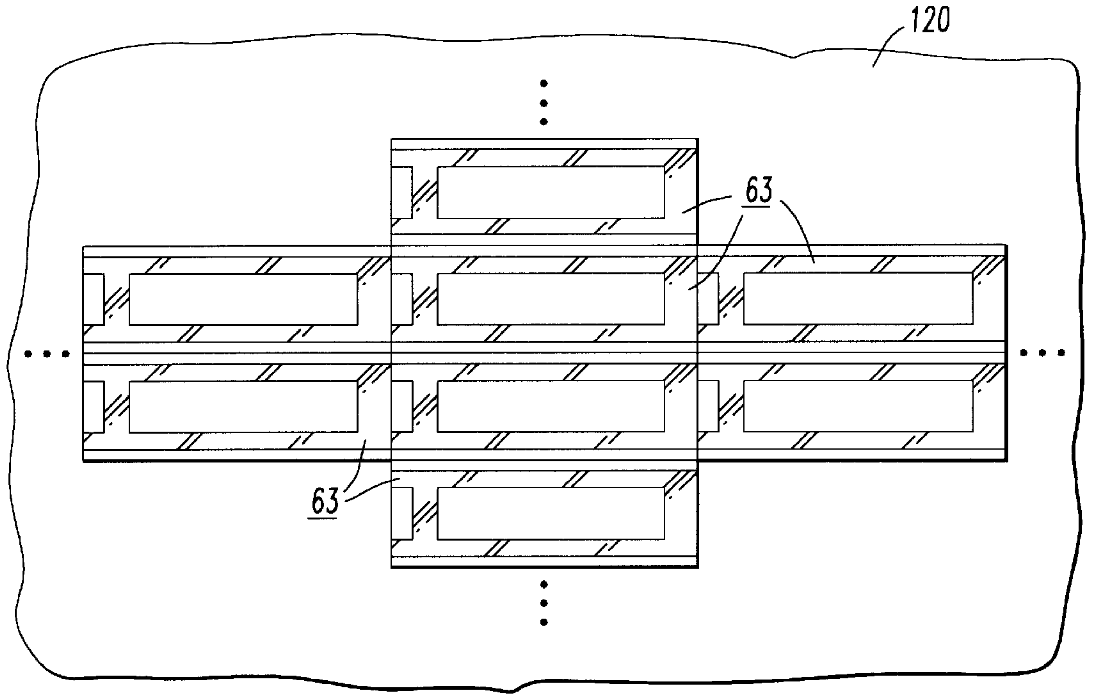

As indicated in FIG. 3C, top plates 63 may also be fabricated on a wafer, 120, however, only strip line deposition is required.

Cesium is an element which reacts violently in air and water and is corrosive to many materials. All of the plates 62, 63 and 64 are exposed to the cesium vapor and accordingly, the wafers 116, 118 and 120, from which they are made must be of a material which is inert to the cesium. Sodium borosilicate glasses are known to satisfy this condition.

In addition, when assembled, the plates form a sandwich which must be sealed. The sealing of the wafers may be accomplished by well-known techniques which utilize pressure, increased temperature and electric field technology to result in diffusion and drift-driven bonding between elements. Alternatively, the sealing may be realized with a wax material which is impervious to the cesium. This wax material should have a softening point of greater than around 85° C., have low vapor pressure of around $10^{-6}$ Torr, or less, at 7° C., an application temperature of around 130° C., or lower, and must maintain the necessary sealing properties at the highest operating temperature of the cell. One example of such material is a commercially available wax known as Apiezon wax W, a product of Apiezon Products, a business unit of M & I Materials Ltd.

Another potential wafer material for one or more of the wafers is a single crystal, high resistivity semiconductor such as silicon, to which can be applied well-established fabrication techniques. This material has the added advantage in that integration of electronic components on a single substrate, along with the cesium cell may be possible.

The reactivity of cesium with pure silicon is unknown. If excessive, all surfaces exposed to the cesium must be protected. This may be accomplished by passivating the silicon surfaces with borosilicate sodium oxides. In addition, the seal between plates may be accomplished by electrostatic and pressure sealing at moderate temperatures over a period of time, followed by a stabilizing hydrogen treatment. A hybrid of silicon and glass may also be used.

If silicon is used for the central plate 62, then windows transparent to the laser light must be formed in the end sections 74 and 75, in the vicinity of lens portions 86 and 87. Such windows may be formed by If silicon is used for the central plate 62, then windows transparent to the laser light must be formed in the end sections 74 and 75, in the vicinity of lens portions 86 and 87. Such windows may be formed by converting these regions to silicon oxide or silicon dioxide, with subsequent passivation.

Due to the highly reactive cesium, the assembly, or partial assembly, of the cell structure 60 should take place in a manufacturing chamber under vacuum conditions. Such vacuum manufacturing chamber is denoted by numeral 122 in FIG. 4A. Within chamber 122 is a thermal plate 124 operable to be heated as well as cooled. Depending from plate 124 is a plurality of needles 125 in an array that matches the positions of the cesium reservoirs 90. A source 128 of cesium within the chamber 122 is opened resulting in an emission of cesium vapor 129.

Plate 124 is initially cooled, causing the vapor 129 to condense on the needles 125. For ease of assembly, prior to its introduction into the chamber 122, the wafer 116, containing the central plates 62 may be brought into registration with wafer 118 containing the bottom plates 64, and the two wafers sealed, thus defining the cesium reservoirs 90.

Figure 4A:
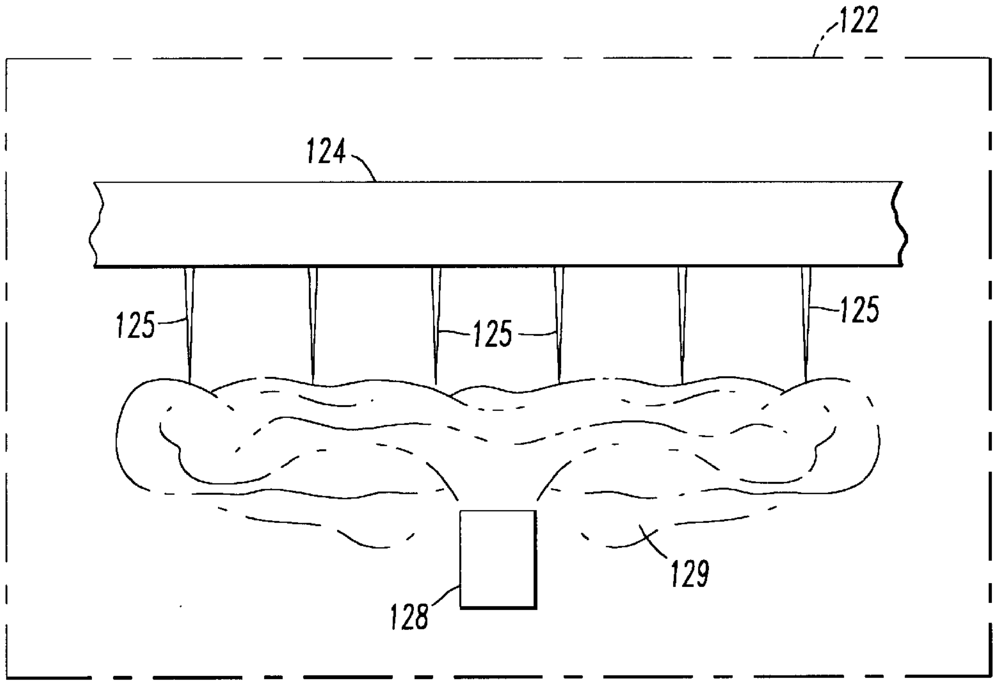
FIGS. 4A, 4B and 4C illustrate certain steps in the fabrication of the cell structure of FIG. 2.
Figure 4B:
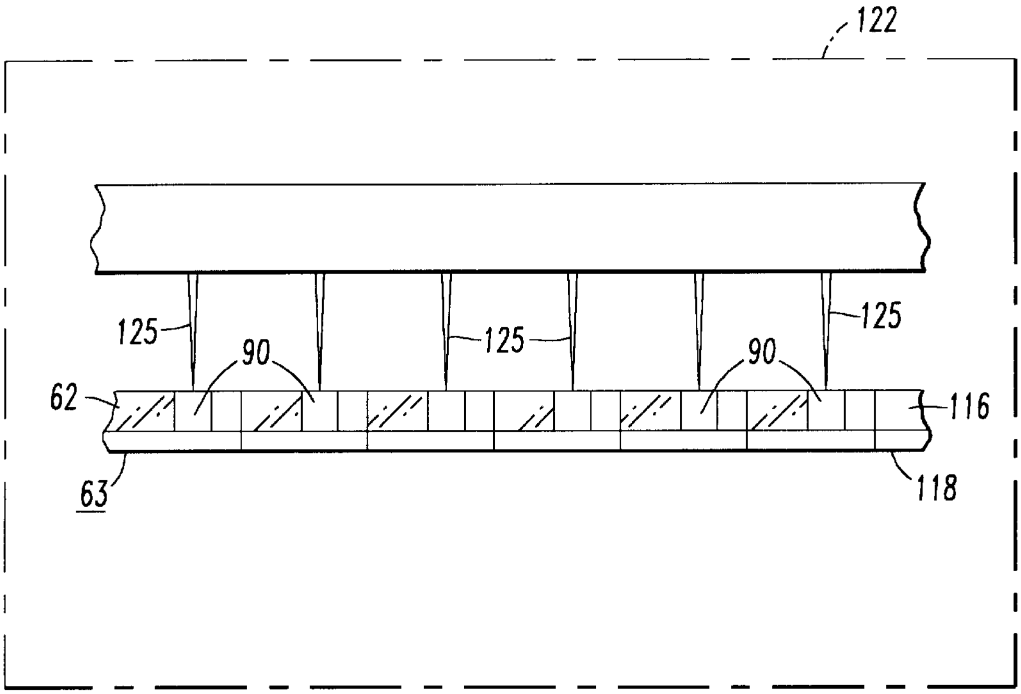

As illustrated in FIG. 4B, the joined wafers 116 and 118 are positioned below the needles 125, which are spaced in two dimensions to correspond to the spacing of the reservoirs 90. The plate 124 is then heated causing the condensed cesium to liquefy and drop into the respective reservoirs 90.

Figure 4C:
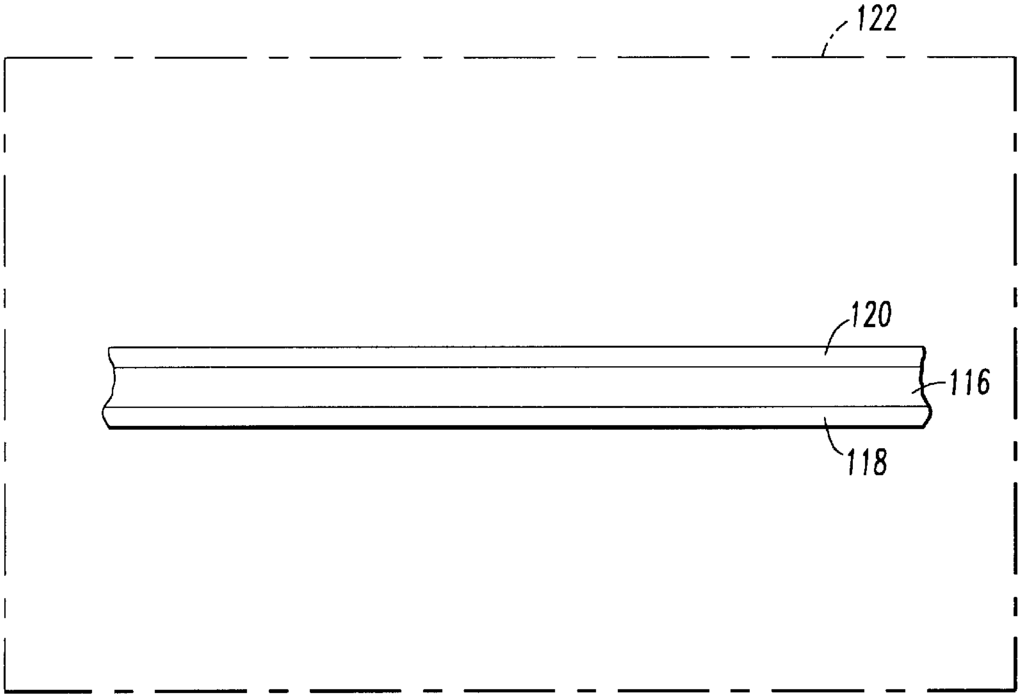

Thereafter, and as illustrated in FIG. 4C, subsequent to an application of a sealant, applied within the chamber plurality of simultaneously fabricated cesium cell structures 60. The depositions of strip line electrodes 110 and 112 may take place prior to operations within the chamber 122, or may be deposited subsequent to removal of the joined wafers, as long as the deposition process temperature is compatible with the sealant utilized to join the wafers.

Once the cell structure 60 has been formed, other components may be added to make a complete physics package. One such example of a physics package 140 is illustrated in the cross-sectional view of FIG. 5. As previously brought out, the microwave excitation arrangement comprises strip line electrode 110 (as well as 112 shown in FIG. 2) deposited on the top surface of top plate 63. A metallic layer 142 serves as the ground plane for the microwave excitation arrangement and is separated from the deposited heater 104 and sensor 106 by an insulating layer 144.

A solenoidal magnetic C-field coil 146 surrounds insulating layer 148, and C-field coil 146 is surrounded by another insulating layer 150. A mu-metal, or other high permeability magnetic shield 152 is provided, and forms the outside of the physics package 140.

Figure 5:
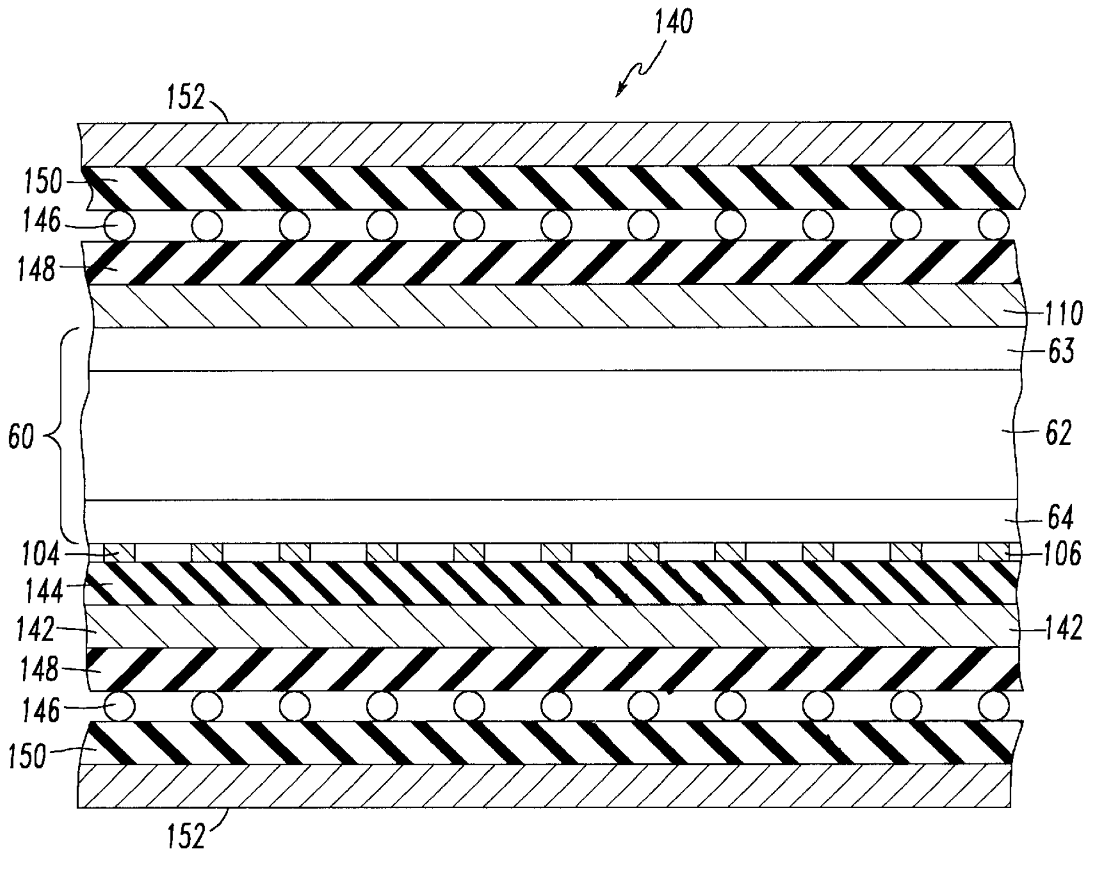
FIG. 5 is a sectional view of a physics package in accordance with the present invention.

By utilizing the manufacturing techniques described herein, the individual plates 62, 63 and 64 may have an outside area of around 2 $cm^2$, or less, and when joined, will form a cell structure 60 of around 0.8 $cm^3$ or less. The thickness of the components of FIG. 5 are greatly exaggerated for clarity, however they will add less than around 0.2 $cm^3$, making a total volume of around 1 $cm^3$, or less, for the entire physics package.

It will be readily seen one of ordinary skill in the art that the present invention fulfills all of the objects set forth herein. After reading the foregoing specification, one of ordinary skill in the art will be able to effect various changes, substitutions of equivalents and various other aspects of the present invention as broadly disclosed herein. It is therefore intended that the protection granted hereon be limited only by the definition contained in the appended claims and equivalents. Having thus shown and described what is at present considered to be the preferred embodiment of the present invention, it should be noted that the same has been made by way of illustration and not limitation. Accordingly, all modifications, alterations and changes coming within the spirit and scope of the present invention are herein meant to be included.

What is claimed is:

1. Physics package apparatus for a cell type atomic clock, comprising:

A) a cell structure having a central plate sandwiched between top and bottom plates;

B) said central plate having a central interior aperture which together with said top and bottom plates forms an internal cavity for containment of an active vapor;

C) said central plate including a reservoir for a source of said active vapor and a channel connecting said reservoir with said internal cavity.

2. Apparatus according to claim 1 wherein:

A) said central plate includes first and second end sections; and

B) said first end section includes a first aperture for placement of a laser diode operable to project a laser beam through said vapor in said cavity.

3. Apparatus according to claim 2 wherein:

A) said second end section includes a second aperture for placement of a detector operable to detect said laser beam projected through said vapor in said cavity.

4. Apparatus according to claim 2 wherein:

A) said central interior aperture includes a curved wall portion adjacent said first aperture, forming a lens for shaping and focusing said laser beam.

5. Apparatus according to claim 3 wherein:

A) said central interior aperture includes a curved wall portion adjacent said second aperture, forming a lens for shaping and focusing said laser beam projected through said vapor, onto said detector.

6. Apparatus according to claim 2 wherein:

A) said reservoir is in one of said end sections.

7. Apparatus according to claim 1 which includes:

A) a heater disposed on the underside of said bottom plate and operable to heat said vapor in said internal cavity.

8. Apparatus according to claim 1 which includes:

A) a temperature sensor disposed on the underside of said bottom plate below said reservoir and operable to obtain an indication of the temperature of the contents of said reservoir.

9. Apparatus according to claim 1 which includes:

A) a microwave coupling arrangement operable to couple microwave energy into said vapor-containing internal cavity.

10. Apparatus according to claim 9 wherein:

A) said microwave coupling arrangement includes i) at least two conducting strip line electrodes deposited on the top surface of said top plate and ii) a ground plane disposed below said bottom plate.

11. Apparatus according to claim 1 wherein:

A) said central, top and bottom plates are of borosilicate glass.

12. Apparatus according to claim 1 wherein:

A) at least one of said central, top and bottom plates is of a single crystal semiconductor having a coating thereon, said coating being impervious to said vapor.

13. Apparatus according to claim 12 wherein:

A) said semiconductor is silicon.

14. Apparatus according to claim 1 which additionally includes:

A) a laser diode positioned to project a laser beam through said vapor in said cavity;

B) a detector positioned to detect said laser beam projected through said cavity;

C) a heater disposed on the underside of said bottom plate and operable to heat said vapor in said internal cavity;

D) a microwave coupling arrangement operable to couple microwave energy into said vapor-containing internal cavity;

E) a C-field winding surrounding said microwave coupling arrangement to generate a uniform background magnetic field, to minimize the effects of any stray external magnetic fields;

F) an insulating layer disposed between said microwave coupling arrangement and said C-field winding; and G) a magnetic field metallic shield surrounding said insulating layer to further isolate said cell structure from external fields.

15. Apparatus according to claim 1 wherein:

A) a plurality of said central plates are formed on a first wafer;

B) a plurality of said top plates are formed on a second wafer;

C) a plurality of said bottom plates are formed on a third wafer; and wherein

D) said plates are joined together, with said first wafer sandwiched between said second and third wafers, and the joined wafers subsequently cut into individual said cell structures.

16. Apparatus according to claim 15 wherein:

A) at least said first and second wafers are joined in a vacuum chamber.

17. Apparatus according to claim 16 wherein:

A) at least said first and second wafers are sealed with a wax material which has a softening point of greater than around 85° C., has a low vapor pressure of around $\leqq 10^{-6}$ Torr at 70° C., and has an application temperature of around $\leqq$130° C.

* * * * *